United States Patent [19]

Kobayashi

[11] Patent Number: 5,532,186
[45] Date of Patent: Jul. 2, 1996

[54] PROCESS FOR MANUFACTURING BUMPED TAB TAPE

[75] Inventor: Yasushi Kobayashi, Kawasaki, Japan

[73] Assignee: Fujitsu Limited, Kawasaki, Japan

[21] Appl. No.: 319,486

[22] Filed: Oct. 7, 1994

Related U.S. Application Data

[63] Continuation of Ser. No. 958,637, Oct. 9, 1992, abandoned.

[30] Foreign Application Priority Data

Oct. 11, 1991 [JP] Japan .................. 3-263632

[51] Int. Cl.⁶ .................. H01L 21/48; H01L 21/71
[52] U.S. Cl. .................. 437/182; 437/183; 437/220; 228/180.22
[58] Field of Search .................. 228/180, 22; 437/182, 437/183, 220; 257/673, 737, 738, 780

[56] References Cited

U.S. PATENT DOCUMENTS

| | | | |
|---|---|---|---|
| 3,134,935 | 5/1964 | Parsons et al. | 317/234 |
| 4,396,457 | 8/1983 | Bakermans | 257/673 |
| 4,916,516 | 4/1990 | Miles et al. | 257/780 |
| 5,123,163 | 6/1992 | Ishikawa et al. | 257/738 |
| 5,132,772 | 7/1992 | Fetty | 357/68 |

FOREIGN PATENT DOCUMENTS

| | | | |
|---|---|---|---|
| 60-4963 | 3/1985 | Japan | 257/738 |
| 01241196 | 9/1989 | Japan . | |
| 1-305541 | 12/1989 | Japan . | |

OTHER PUBLICATIONS

*Microelectronics Packaging Handbook*, New York, Van Nostrand Rewhold, 1989. pp. 374, 409–426, and 828–829. TK7874.T824 1988.

Primary Examiner—George Fourson
Assistant Examiner—David E. Graybill
Attorney, Agent, or Firm—Armstrong, Westerman, Hattori, McLeland & Naughton

[57] ABSTRACT

A manufacturing method for a TAB tape which forms a plurality of bumps on a plurality of sheet-like leads of the TAB tape. First, the leads are fixed to a belt-shaped tape member having a plurality of first openings arranged at equal intervals in a longitudinal direction and a plurality of second openings formed around each of the first openings. In fixing each lead to the tape member, one end portion of the lead is exposed to each first opening, and the other end portion of the lead is exposed to each second opening. Secondly, a point is pressed onto a surface of each lead to form a plurality of recesses on the surface of each lead. Thirdly, a metal ball is seated in each recess, and is then heated to be molten so that a part of the metal ball may substantially semispherically project from the surface of the lead. Thus, a metal bump is formed as a substantially semispherical part projecting from the surface of each lead. Instead of the use of the metal ball, a mixture of a metal powder and a paste may be filled in each recess. In this case, the mixture filled in each recess is heated to be molten so that a part of the mixture may substantially semispherically project from the surface of each lead, thus forming the metal bumps on the surface of each lead.

6 Claims, 6 Drawing Sheets

PROCESS FOR MANUFACTURING BUMPED TAB TAPE

This application is a continuation of application Ser. No. 07/958,637 filed Oct. 9, 1992, now abandoned.

BACKGROUND OF THE INVENTION

1. Field of the Invention

The present invention relates to a TAB (Tape Automated Bonding) tape and a manufacturing method therefor.

2. Description of the Related Art

In accordance with a demand of high-density mounting and a demand of increased speed of signal processing in electronic devices, there has been advanced a bare chip mounting technology such that an IC (Integrated Circuit) chip is directly mounted on a substrate or the like. As an example of the bare chip mounting technology, a TAB (Tape Automated Bonding) process is known. The TAB process employs a TAB tape constituted of an insulating tape member and a plurality of leads or fingers formed on the tape member. The tape member has a plurality of sprocket holes formed along opposite side edges like a movie film. The IC chip is connected to the TAB tape by inner lead bonding, and thereafter an outer peripheral portion of each lead of the TAB tape is connected to a conductor pattern on the substrate by outer lead bonding.

The tape member is normally formed from an elongated polyimide film. The use of such an elongated film enables the TAB tape to be wound around a reel, which will become useful for rationalization in a mounting step. Furthermore, according to the TAB process, it is advantageous that a pitch of bonding portions can be reduced and that an increase in size of the chip with an increase in the number of terminals can be met.

Conventionally, metal bumps formed on electrodes on the chip are bonded to each lead of the TAB tape. However, since it is difficult to form the metal bumps on the chip, there has recently been developed a method of forming the metal bumps on each lead rather than on the chip. The metal bumps are formed in order to make the bonding easy and prevent breakage or the like of the IC chip in bonding. An example of the method of forming the metal bumps on each lead of the TAB tape in the prior art is to deposit a bonding metal on a surface of each lead at predetermined positions by plating.

However, the formation of the metal bumps by plating requires a costly plating equipment. Furthermore, a process is complicated to require an advanced technique.

SUMMARY OF THE INVENTION

It is therefore an object of the present invention to provide a manufacturing method for a TAB tape which can easily form metal bumps on each lead.

It is another object of the present invention to provide a TAB tape which enables an IC chip to be easily mounted on a printed wiring board.

In accordance with an aspect of the present invention, there is provided a TAB tape comprising a belt-shaped tape member having a plurality of sprocket holes formed along opposite side edges, a plurality of first openings for inner lead bonding, formed at a transversely substantially central portion so as to be arranged at equal intervals in a longitudinal direction, and a plurality of second openings for outer lead bonding, formed around each of said first openings; a plurality of sheet-like leads fixed to said tape member, each of said leads having a first end portion exposed to each of said first openings and a second end portion exposed to each of said second openings, each of said first and second end portions of said each lead having at least one recess; and a plurality of metal bumps for bonding, each filled in said recess so as to project from a surface of said each lead.

In accordance with another aspect of the present invention, there is provided a manufacturing method for a TAB tape, comprising the steps of providing a belt-shaped tape member having a plurality of sprocket holes formed along opposite side edges, a plurality of first openings for inner lead bonding, formed at a transversely substantially central portion so as to be arranged at equal intervals in a longitudinal direction, and a plurality of second openings for outer lead bonding, formed around each of said first openings; fixing a plurality of sheet-like leads to said tape member, each of said leads having a first end portion exposed to each of said first openings and a second end portion exposed to each of said second openings; pressing a pyramidal or conical point onto a surface of said each lead to form at least one recess at each of said first and second end portions of said each lead; seating a metal piece in said each recess; and melting said metal piece seated in said each recess so that a part of said metal piece substantially semispherically projects from a surface of said each lead to form a plurality of metal bumps on said each lead.

Instead of the use of the metal piece, a mixture of a metal powder and a paste may be filled in each recess. In this case, the mixture filled in each recess is molten so that a part of the mixture may substantially semispherically project from the surface of each lead, thus forming the metal bumps on the surface of each lead.

In the manufacturing method for the TAB tape according to the present invention, the pyramidal or conical point is used for the formation of each recess on the surface of each lead. Owing to the pyramidal or conical shape of the point, the recess can be easily formed with a relatively small force to be applied to the lead by the point. Since such a relatively small force is applied to the lead, deformation of an outline shape of the lead due to the formation of the recess can be suppressed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

Figure 1:
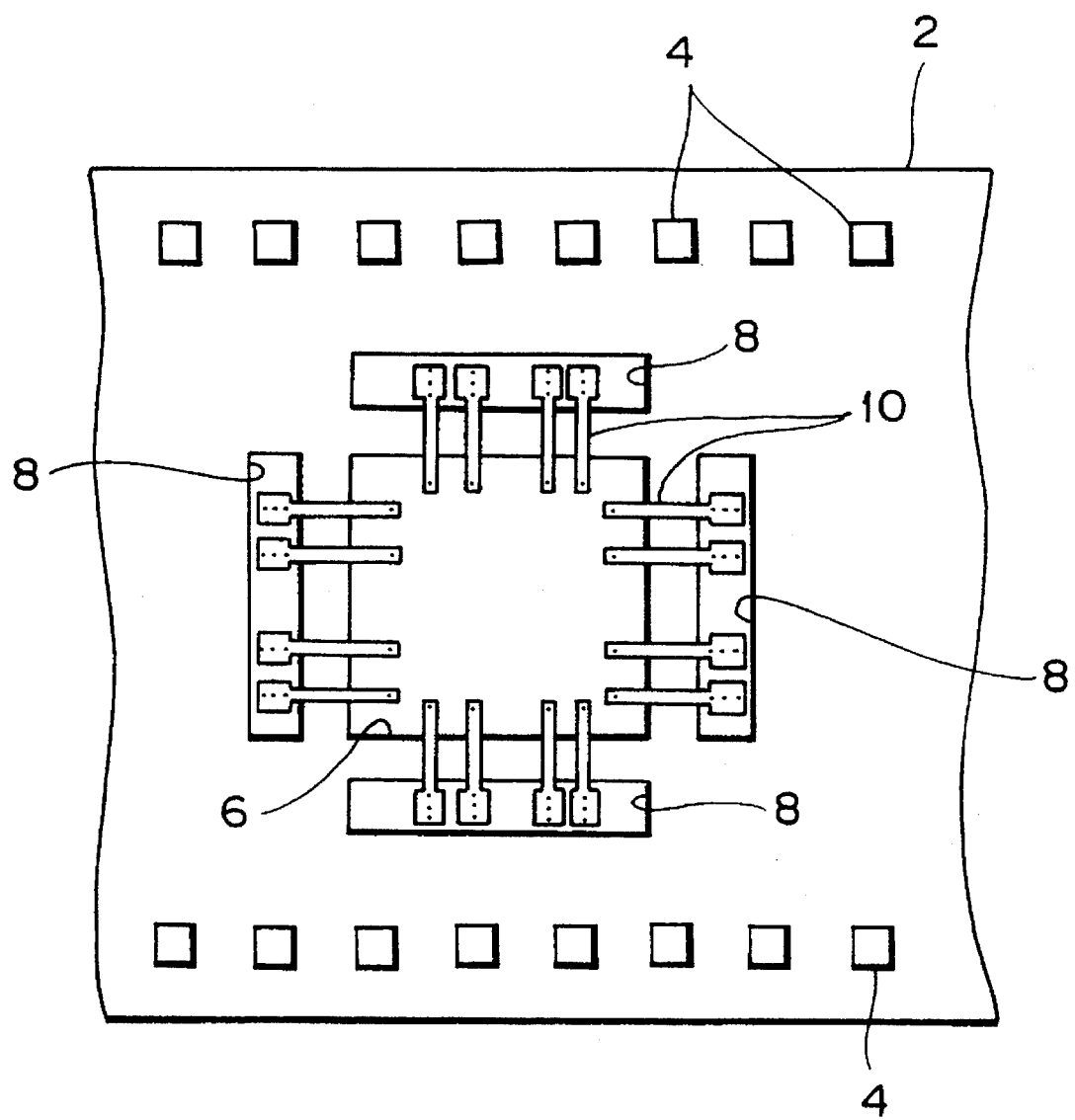
FIG. 1 is a plan view of a TAB tape according to a preferred embodiment of the present invention.
Figure 2:
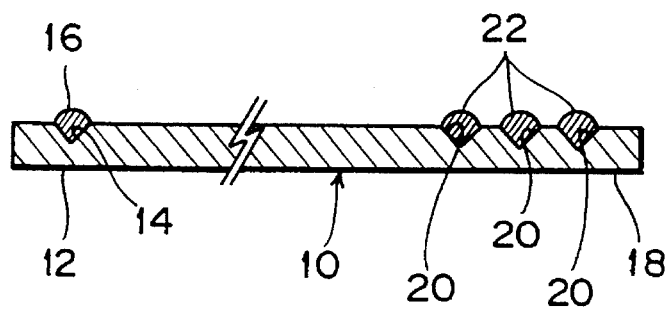
FIG. 2 is a vertical sectional view of a lead and metal bumps of the TAB tape show in FIG. 1.

FIG. 1 is a plan view of a TAB tape according to the preferred embodiment of the present invention, and FIG. 2 is a vertical sectional view of a lead and bumps shown in FIG. 1. Referring to FIG. 1, reference numeral 2 designates a flexible tape member formed of a thin film resin such as a polyimide film. The tape member 2 is formed at its transversely opposite end portions with a plurality of sprocket holes 4 for feeding. Along each transverse end portion of the tape member 2, the sprocket holes 4 are arranged at equal intervals.

Further, the tape member 2 is formed at its transversely substantially central portion with a plurality of rectangular first openings 6 for inner lead bonding. The first openings 6 are arranged at equal intervals in a longitudinal direction of the tape member 2. Four second openings 8 for outer lead bonding are formed around each first opening 6 in respectively parallel relationship to four sides of the first opening 6. An inner peripheral length of each first opening 6 is larger than an outer peripheral length of an IC chip to be connected by inner lead bonding. Reference numeral 10 designates a plurality of leads or fingers formed of a conductive material. Each lead 10 is fixed to the tape member 2 in such a manner that one end portion of the lead 10 is exposed to the first opening 6 and the other end portion is exposed to the second opening 8 adjacent to one side of the first opening 6. The number of the leads 10 is set to a suitable value (e.g., hundreds) in accordance with the number and position of pads on the IC chip to be bonded.

As shown in FIG. 2, each lead 10 is a sheet member having an inner lead portion 12 exposed to the first opening 6 and an outer lead portion 18 exposed to the second opening 8. In this preferred embodiment, a single recess 14 is formed on an upper surface of the inner lead portion 12, and three recesses 20 are formed on an upper surface of the outer lead portion 18. The recesses 14 and 20 are respectively filled with bumps 16 and 22 formed of a bonding metal. The bumps 16 and 22 project from the upper surface of the lead 10.

The TAB tape mentioned above is manufactured by the following method. First, a method of forming the recesses 14 and 20 on the lead 10 will be described with reference to FIGS. 3 and 4.

Figure 3:
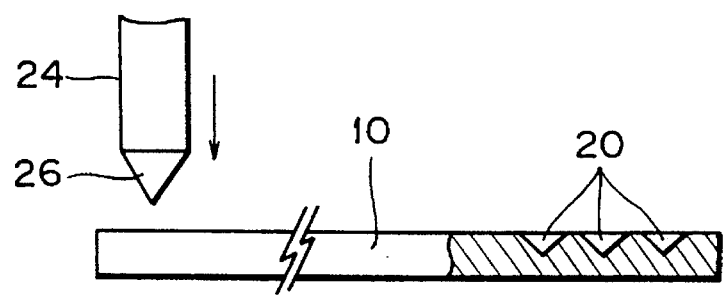
FIG. 3 is a partially sectional side view illustrating a method of forming recesses on the lead of the TAB tape.

Referring to FIG. 3, reference numeral 24 designates a needle formed at an end thereof with a pyramidal point 26 formed of diamond or the like. In this preferred embodiment, the point 26 has a shape of regular quadrangular pyramid. The point 26 of the needle 24 is first brought into contact with the upper surface of the lead 10 at a position where each recess is to be formed. Then, the needle 24 is pushed down to the upper surface of the lead 10 in a direction perpendicular thereto. As the lead 10 is softer in material than the point 26, the lead 10 is plastically deformed by the force of the point 26 applied to the upper surface of the lead 10. As a result, each recess having a shape corresponding to the shape of the point 26 is formed on the upper surface of the lead 10.

Figure 4:
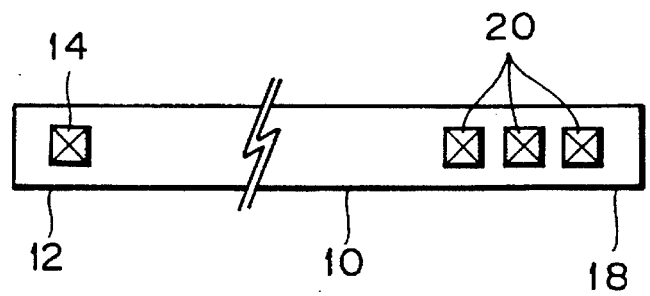
FIG. 4 is a plan view of the lead on which the recesses are formed.

There is shown in FIG. 4 a plan view of the lead 10 having the recesses 14 and 20 formed by the above method. That is, the single recess 14 is formed on the upper surface of the inner lead portion 12 of the lead 10, and the three recesses 20 are formed on the upper surface of the outer lead portion 18 of the lead 10. In this preferred embodiment, the point 26 having the shape of regular quadrangular pyramid is used so that a base side of the point 26 is parallel to a side surface of the lead 10. Accordingly, each of the recesses 14 and 20 formed on the upper surface of the lead 10 becomes a shape of regular quadrangular pyramid, a base side of which is parallel to the side surface of the lead 10. Therefore, distortion of an outline shape of the lead 10 due to the formation of each recess on the lead 10 can be suppressed. Further, a sufficient size of each recess can be obtained with a relatively small force of the point 26 to be applied to the upper surface of the lead 10.

Figure 5A:
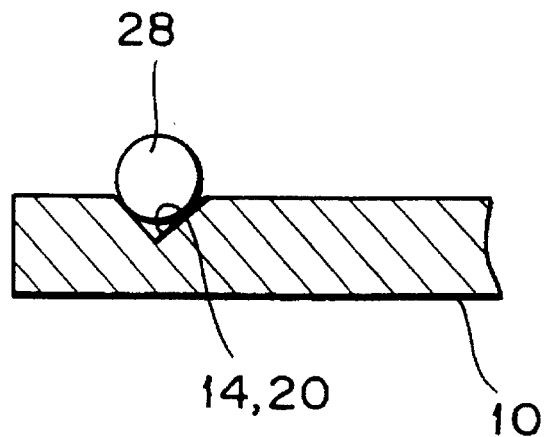
FIGS. 5A and 5B are vertical sectional views illustrating a method of forming the metal bumps.

Next, a method of forming the bumps 16 and 22 in the recesses 14 and 20, respectively, will be described with reference to FIGS. 5A and 5B. First, a metal ball 28 is seated in each of the recesses 14 and 20 as shown in FIG. 5A. Since each recess has the shape of regular quadrangular pyramid, the metal ball 28 can be easily seated in each recess. A preferable material of the metal ball 28 is Au (gold), Cu (copper), or alloy containing these metals as a main component in consideration of a bonding quality by the bumps to be formed.

Figure 5B:
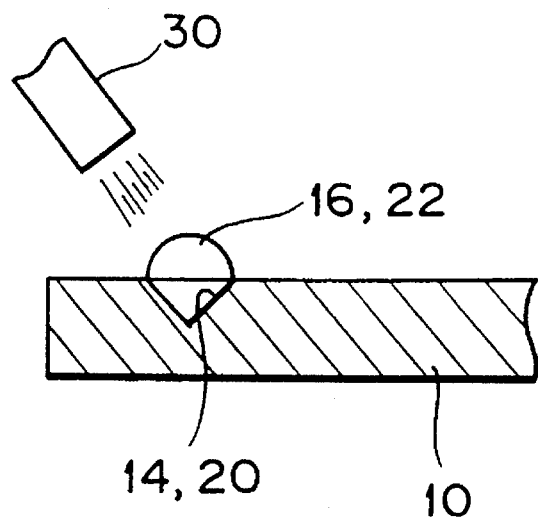

Then, as shown in FIG. 5B, the metal ball 28 is heated to be molten by using a hydrogen torch 30 or the like. As a result, each recess is filled with a part of the molten metal of the metal ball 28, and the remaining part of the molten metal is substantially semispherically protruded from each recess by a surface tension. Thereafter, the molten metal is cooled to be solidified. As a result, the semispherically protruded portion is formed as each of the bumps 16 and 22 on the upper surface of the lead 10.

As an example, the lead 10 has a thickness of 40–50 μm and a width of about 100 μm. Further, each recess having the shape of regular quadrangular pyramid has a depth of about 25 μm, and a volume of the metal ball 28 is set so that a height of each bump becomes about 40 μm. According to this forming method, the bumps thus formed can fit enough for practical use.

Figure 6A:
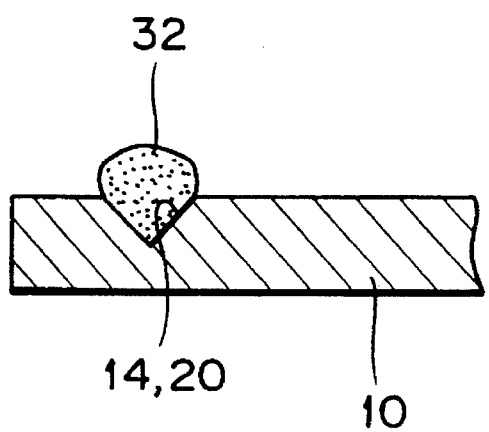
FIGS. 6A and 6B are vertical sectional views illustrating another method of forming the metal bumps.
Figure 6B:
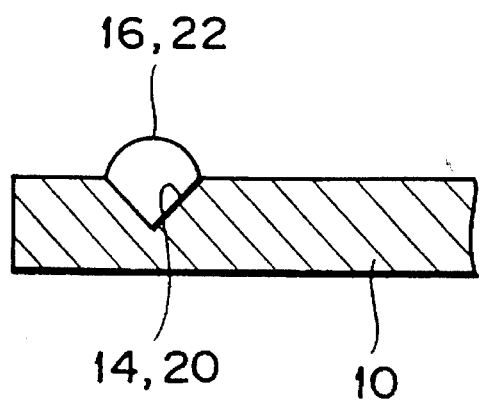

Another method of forming the bumps 16 and 22 in the recesses 14 and 20, respectively, will now be described with reference to FIGS. 6A and 6B. First, as shown in FIG. 6A, a solder cream 32 as a mixture of a powder of Pb (lead)/Sn (tin) solder and a paste is filled into each recess of the lead 10. Then, the solder cream 32 is reflow-molten in a heating oven or the like to vaporize the paste, thus forming the bumps 16 and 22 each having a substantially semispherical shape protruded from the upper surface of the lead 10 as shown in FIG. 6B. In this preferred embodiment, a quantity of the solder cream 32 and a mixture ratio between the metal powder and the paste in the solder cream 32 are set so that a height of each bump becomes a desired value. The filling of the solder cream 32 into each recess of the lead 10 may be carried out by using a dispenser. Alternatively, the filling of the solder cream 32 may be carried out by a printing method to be used in a conventional surface mounting technology.

The Pb/Sn bumps formed by this method have a melting point lower than the Au or Cu bumps formed by the method in the previous preferred embodiment. Accordingly, the Pb/Sn bumps are suitable for bonding at low temperatures.

Figure 7:
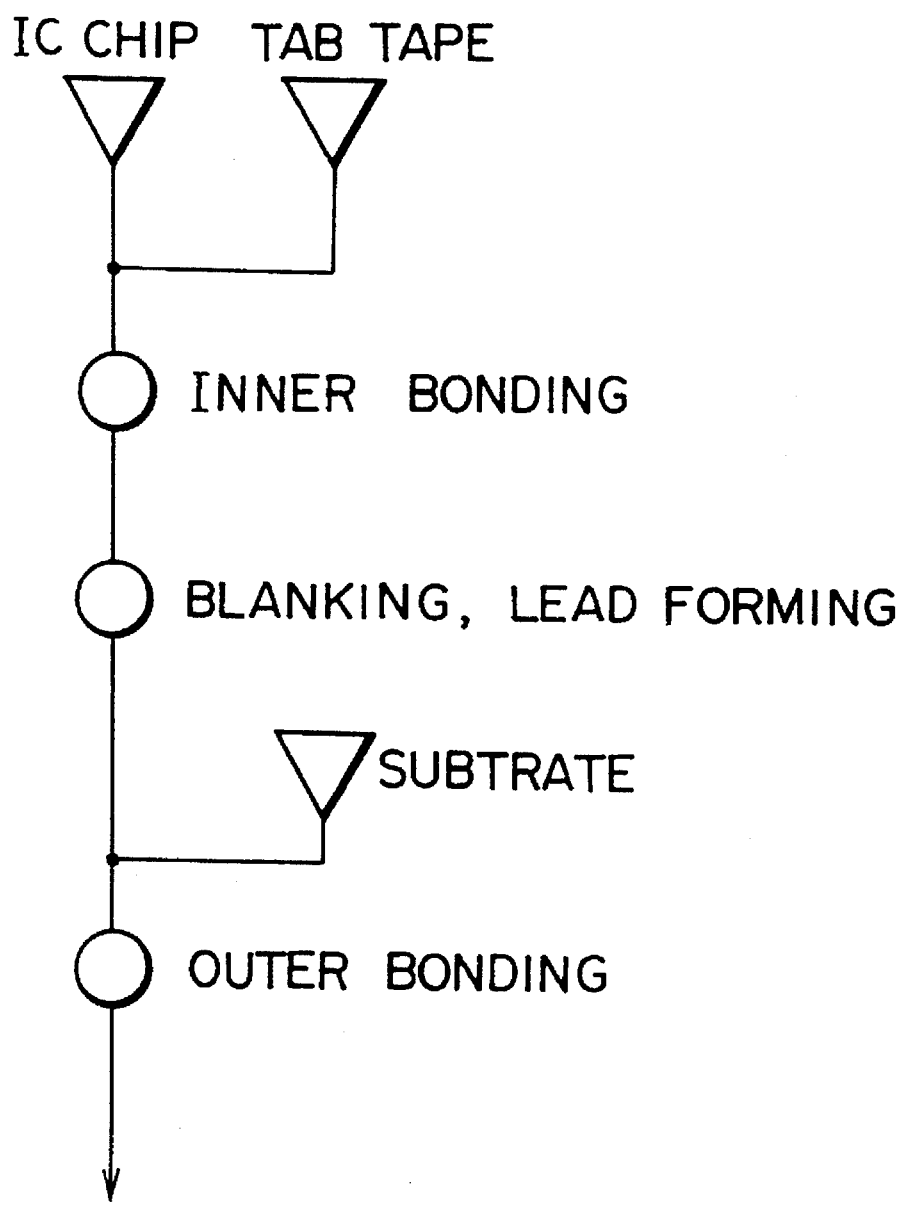
FIG. 7 is a flowchart illustrating a process of mounting an IC chip with use of the TAB tape according to the present invention.
Figure 8:
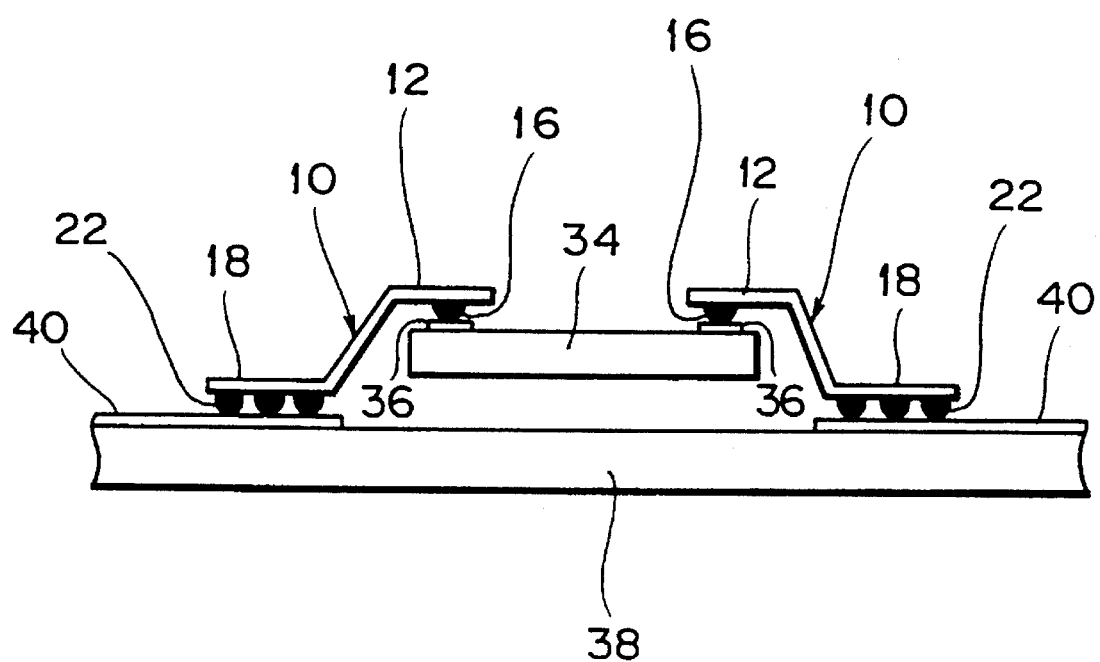
FIG. 8 is a side view of the IC chip mounted on a printed wiring board by the TAB process according to the present invention.

FIG. 7 shows a process of mounting an IC chip with use of the TAB tape manufactured above. In the flowchart shown in FIG. 7, the triangles stand for parts to be charged, and the circles stand for operations to be carried out to the parts charged. Further, FIG. 8 shows a side elevation of the IC chip mounted on a substrate by this process.

First, the bump 16 formed at the inner lead portion 12 of each lead 10 is bonded to a pad (electrode) 36 of an IC chip 34 (inner lead bonding). In the inner lead bonding, the bump 16 and the pad 36 are heated and pressurized to thereby mutually diffuse a component of the bump 16 and a component of the pad 36. As a result, the lead 10 and the IC chip 34 are mechanically and electrically connected with each other. Further, as the bump 16 is formed on the lead 10, an energy necessary for the inner lead bonding can be made smaller than that in the case of directly bonding the lead to the pad, with the result that breakage or the like of the IC chip 34 can be prevented.

Then, a portion of the tape member 2 to which each lead 10 is fixed is cut away from the other portion by blanking or the like, and the lead 10 is formed into a desired shape. For instance, the lead 10 is bent at two positions thereof to be formed into a crank shape. Then, the bumps 22 formed at the outer lead portion 18 of each lead 10 are bonded to a conductor pattern 40 of a printed wiring board 38 (outer lead bonding). In the outer lead bonding, it is unnecessary to precoat a solder to the conductor pattern 40 of the printed wiring board 38 since the bumps 22 are previously formed on the lead 10.

Although the point 26 to be used for the formation of each recess on the lead 10 has the shape of regular quadrangular pyramid in the above preferred embodiments, such a shape is merely illustrative and various modifications may be made in the present invention. For example, the shape may be triangular pyramidal or conical.

What is claimed is:

1. A manufacturing method for producing a TAB tape containing leads provided with metal bumps for subsequent connection to associated conductors, comprising the steps of:

providing a belt-shaped tape member having a plurality of sprocket holes formed along opposite side edges, a plurality of first openings for inner lead bonding formed at a transversely substantially central portion so as to be arranged at equal intervals in a longitudinal direction, and a plurality of second openings for outer lead bonding formed around each of said first openings;

providing a plurality of sheet-like leads having oppositely facing surfaces, one of which defining a contact surface for bonded engagement with a facing surface of an associated conductor, fixing each of said leads to said tape with a first end portion of said contact surface exposed to each of said first openings and a second end portion of said contact surface exposed to each of said second openings;

pressing a pyramidal or conical point onto said contact surface of said each lead to form at least one recess therein at each of said first and second end portions of said each lead;

seating a piece of bondable metal in said each recess; and melting said metal piece seated in said each recess and cooling it to permit it to solidify so that, when solidified upon cooling, said metal piece is bonded to said lead and a part thereof substantially hemispherically projects from said contact surface of said each lead to form a plurality of bumps of bondable metal projecting from the contact surface of said each lead which are effective for subsequently engaging and thereby effecting a bonded connection to an associated conductor.

2. The manufacturing method as defined in claim 1, wherein said point has a shape of regular quadrangular pyramid having a base side parallel to a side surface of said each lead.

3. The manufacturing method as defined in claim 1, wherein said metal piece is a metal ball formed of metal selected from the group consisting of gold, copper, and alloy thereof.

4. A manufacturing method for producing a TAB tape containing leads provided with metal bumps for subsequent connection to associated conductors comprising steps of:

providing a belt-shaped tape member having a plurality of sprocket holes formed along opposite side edges, a plurality of first openings for inner lead bonding, formed at a transversely substantially central portion so as to be arranged at equal intervals in a longitudinal direction, and a plurality of second openings for outer lead bonding, formed around each of said first openings;

providing a plurality of sheet-like leads having oppositely facing surfaces, one of which defining a contact surface for bonded engagement with an associated conductor, fixing each of said leads to said tape with a first end portion of said contact surface exposed to each of said first openings and a second end portion of said contact surface exposed to each of said second openings;

pressing a pyramidal or conical point onto said contact surface of said each lead to form at least one recess therein at each of said first and second end portions of said each lead;

filling a mixture of a bondable metal powder and a paste in said each recess; and melting said mixture filled in said each recess and cooling it to permit it to solidify so that, when solidified upon cooling, said mixture is bonded to said lead and a part thereof substantially hemispherically projects from said contact surface of said each lead to form a plurality of bumps of bondable metal projecting from the contact surface of said each lead which are effective for subsequently engaging and thereby effecting a bonded connection to an associated conductor.

5. The manufacturing method as defined in claim 4, wherein said point has a shape of regular quadrangular pyramid having a base side parallel to a side surface of said each lead.

6. The manufacturing method as defined in claim 4, wherein said mixture is a solder cream formed by mixing a powder of Pb/Sn solder as said metal powder with said paste.

* * * * *